(12) United States Patent
Clarke

(10) Patent No.: US 8,223,584 B1
(45) Date of Patent: Jul. 17, 2012

(54) APPARATUS FOR MEMORY INTERFACE CONFIGURATION

(75) Inventor: Philip Clarke, Leatherhead (GB)

(73) Assignee: Altera Corporation, San Jose, CA (US)

( * ) Notice: Subject to any disclaimer, the term of this patent is extended or adjusted under 35 U.S.C. 154(b) by 390 days.

(21) Appl. No.: 12/431,848

(22) Filed: Apr. 29, 2009

(51) Int. Cl.
*G11C 8/00* (2006.01)

(52) U.S. Cl. .......... 365/233.1; 365/189.15; 365/233.11; 711/170; 711/E12.001; 713/500

(58) Field of Classification Search ........... 365/189.15, 365/233.1, 233.11; 711/170, E12.001; 713/500
See application file for complete search history.

(56) References Cited

U.S. PATENT DOCUMENTS

| | | | |
|---|---|---|---|
| 7,590,008 B1 * | 9/2009 | Roge et al. | 365/189.011 |
| 7,965,801 B1 * | 6/2011 | O'Reilly et al. | 375/355 |
| 2004/0103226 A1 * | 5/2004 | Johnson et al. | 710/52 |
| 2008/0201597 A1 * | 8/2008 | Chong et al. | 713/401 |
| 2008/0291758 A1 * | 11/2008 | Chu et al. | 365/194 |

* cited by examiner

*Primary Examiner* — Fernando Hidalgo
(74) *Attorney, Agent, or Firm* — Law Offices of Maximilian R. Peterson

(57) ABSTRACT

An apparatus includes a memory circuit and an interface circuit. The interface circuit is coupled to the memory circuit. The interface circuit selects a phase value of clock signal adapted to clock the memory circuit.

28 Claims, 9 Drawing Sheets

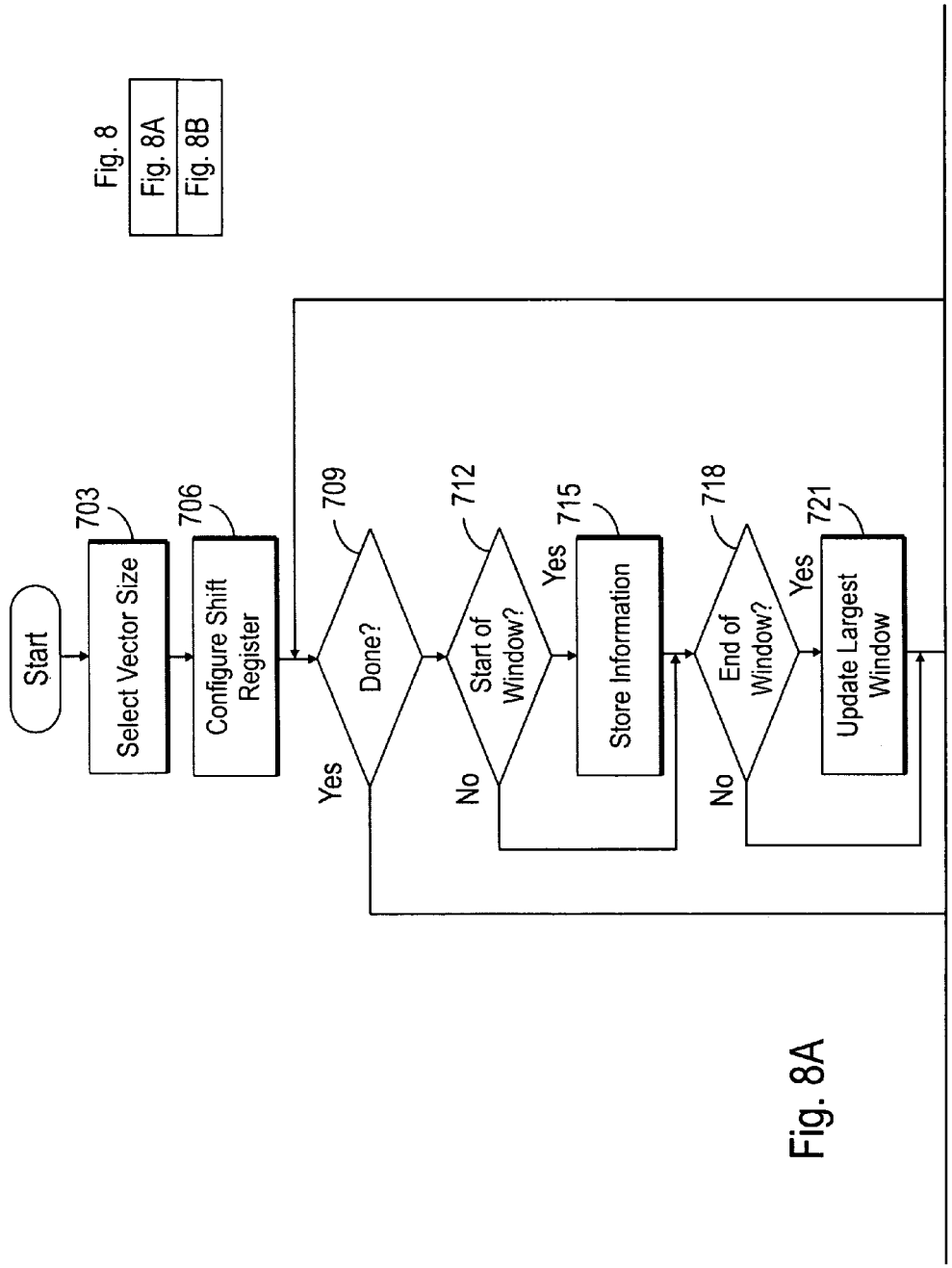

APPARATUS FOR MEMORY INTERFACE CONFIGURATION

TECHNICAL FIELD

The disclosed concepts relate generally to memory devices or circuits and, more particularly, to apparatus for configuring memory interface devices and circuits, and associated methods.

BACKGROUND

Electronic circuitry generally, and integrated circuits (ICs) in particular, have continuously increased in complexity. For example, system-on-a-chip (SoC) devices include a relatively large number of circuits and devices on one IC. One type of circuitry widely used in electronic ICs is memory circuits. Sometimes, the memory circuit uses a given or desired protocol for communication with other circuitry. The protocol typically includes specification for a number of parameters, for example, clock signals, timing of various signals, and the like.

SUMMARY

The disclosed concepts relate generally to memory devices or circuits and, more particularly, to configuring memory interface devices and circuits. One aspect of the disclosed concepts relates to apparatus for configuring memory devices and circuits. In one exemplary embodiment, an apparatus includes a memory circuit, and an interface circuit. The interface circuit is coupled to the memory circuit. The interface circuit selects a phase value of a clock signal adapted to clock the memory circuit.

In another exemplary embodiment, an IC includes a memory circuit, and an interface circuit. The interface circuit is coupled to the memory circuit. The interface circuit provides a clock signal to the memory circuit. The interface circuit includes a shift register that sweeps or changes a phase of the clock signal to select a phase value appropriate for interfacing with the memory circuit.

Another aspect of the disclosed concepts relates to methods of configuring memory devices and circuits. In one exemplary embodiment, a method of operating a memory includes selecting a phase value of a clock signal adapted to clock the memory circuit during a data capture operation. The phase value of the clock signal is selected such that the results of the data capture operation meet a specified criterion.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
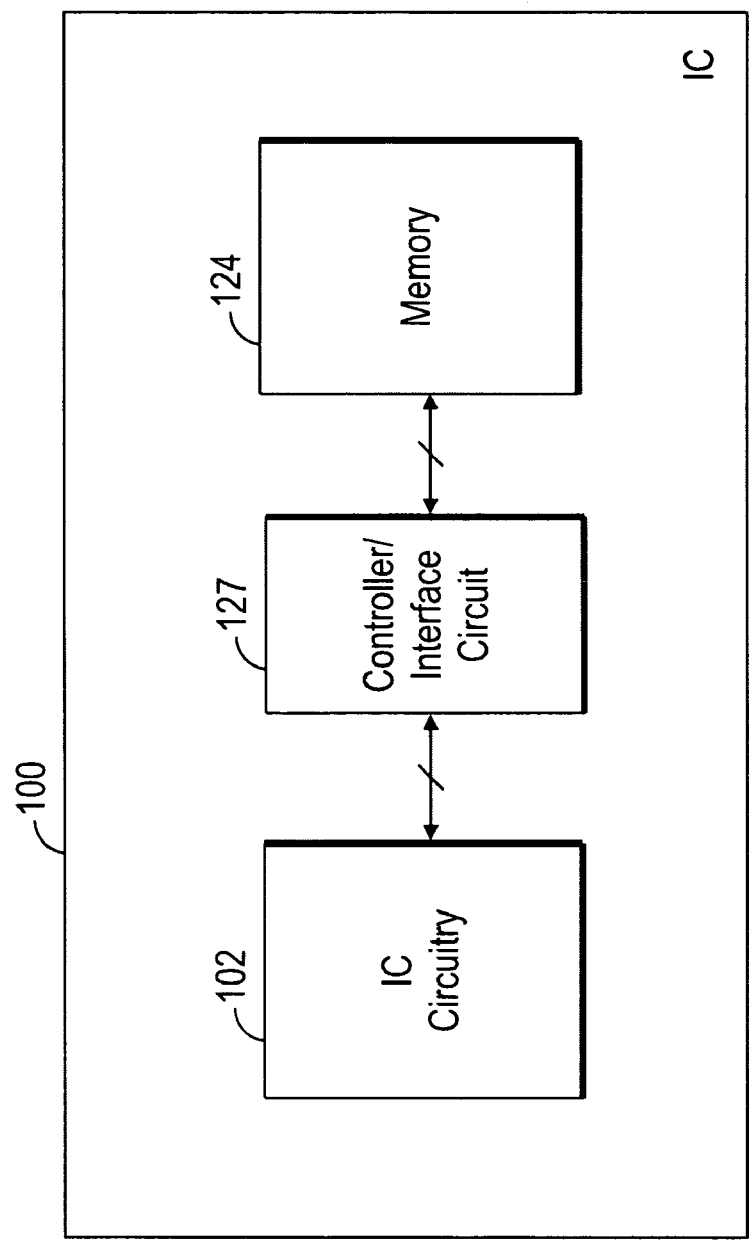
FIG. 1 depicts a simplified general block diagram of an integrated circuit according to an exemplary embodiment.

The disclosed concepts relate generally to memory devices or circuits. More specifically, the disclosed concepts provide apparatus and methods for configuring or calculating settings for memory devices, circuits, and/or interfaces, for example, the clock rate or signal used to clock the memory-related circuitry. One may perform the configuration or calculation of the settings as part of a calibration mechanism, as desired.

The disclosed concepts provide a mechanism for calculating a plurality of settings used by circuitry within an IC or physical layer or circuit (PHY) to communicate with memory devices or circuits via a given or desired interface. Furthermore, as persons of ordinary skill in the art who have the benefit of the description of the disclosed concepts understand, one may also apply the disclosed concepts to memory external to the IC. In this scenario, the memory communicates with the IC via an appropriate mechanism, such as an interface circuit, input/output (I/O) circuitry, and the like.

One may apply the disclosed concepts to circuitry or systems that use a relatively wide variety of types of memory. Examples of memory devices or circuits include double data rate (DDR) memory, for example, DDR2 or DDR3 (generally, DDRn), and Reduced Latency Dynamic Random Access Memory (RLDRAM). More generally, one may apply the disclosed concepts to any interface that returns a source synchronous clock, and uses a destination synchronous clock to resynchronize it to an internal clock domain. As persons of ordinary skill in the art who have the benefit of the description of the disclosed concepts understand, however, one may use the disclosed concepts in conjunction with other types of memory, as desired.

Using apparatus and techniques according to the disclosed concepts provides several benefits. First, it allows simplifying the calculation logic or circuit for the memory settings. Second, it reduces the size and complexity of the memory interface circuits used. Third, it allows intellectual property (IP) re-use within the PHY for many functions (depending on calibration complexity) and, because of its design, it no longer presents a frequency bottleneck within the PHY. Fourth, it accommodates changes in clock frequency in various designs and implementations, and enables higher speed operation of the PHY and higher bandwidth memory interfaces. Fifth, it provides a calculation mechanism for DDR de-skew, write leveling, resynch (resynchronization) and post-amble.

Conceptually, one aspect of the disclosed concepts provides mechanisms and techniques for proper selection of a phase for a clock signal. The clock signal, when used to interface with a memory device or circuit, allows proper communication of the memory device or circuit, while allowing relatively high (or higher) bandwidth memory interfaces. In other words, the disclosed concepts provide a way of dynamically determining the clock phase for appropriate functioning of the memory and the memory interface.

FIG. 1 illustrates a simplified general block diagram of an IC 100 according to an exemplary embodiment. IC 100 may constitute a wide variety of ICs. Examples include general-purpose and special-purpose ICs, application specific ICs (ASICs), and the like, including stacked die and stacked packages.

IC 100 includes memory 124 (one or more memory devices or circuits), and controller/interface circuit 127. In addition, IC 100 includes IC circuitry 102.

As noted above, memory 124 may constitute a variety of desired memory types/circuits. Generally speaking, IC circuitry 102 may include a wide variety of circuitry that read data from and/or write data to, memory 124. Examples include registers, general logic circuits, processors, arithmetic/logic circuits, and the like.

Controller/interface circuit 127 provides a mechanism for communication between memory 124 and IC circuitry 102. Through controller/interface circuit 127, IC circuitry 102 can read data from and/or write data to, memory 124. As described in detail below, controller/interface circuit 127 includes a mechanism for changing a phase of a clock signal used to communicate with memory 124 in order to find the appropriate phase that provides reliable and relatively high-bandwidth communication with memory 124.

As noted above, one may apply the disclosed concepts to a variety of circuits and systems, including a variety of ICs. One example of such an IC constitutes a programmable logic device (PLD).

Figure 2:
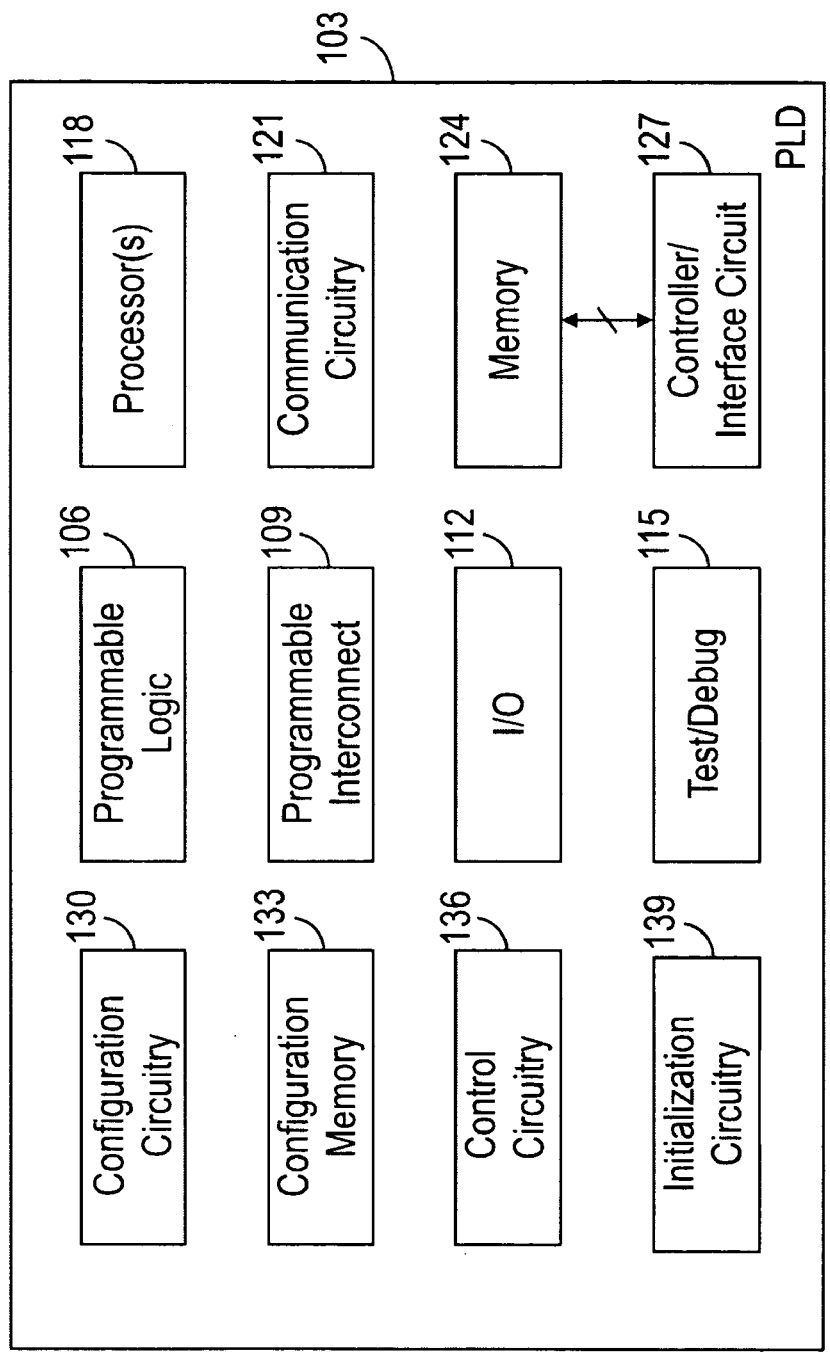
FIG. 2 illustrates a general block diagram of a programmable logic device (PLD) according to an exemplary embodiment

FIG. 2 illustrates a general block diagram of a PLD 103 according to an exemplary embodiment. As described in detail below, similar to IC 100 (see FIG. 1), PLD 103 includes memory 124 and controller/interface circuit 127. Memory 124 and controller/interface circuit may have similar structure and functionality as described above.

PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, and initialization circuit 139, as desired.

Note that the figure shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. Configuration data are typically stored in CRAM 133. The contents of CRAM 133 determine the functionality of various blocks of PLD 103, such as programmable logic 106 and programmable interconnect 109. Initialization circuit 139 may cause the performance of various functions at reset or power-up of PLD 103.

I/O circuitry 112 may constitute a wide variety of I/O devices or circuits, as persons of ordinary skill in the art who have the benefit of the disclosure understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices. As noted, in some embodiments, I/O circuitry 112 may provide a mechanism for communication with memory external to PLD 103.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the disclosure. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the disclosure in this document appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the disclosure in this document understand.

PLD 103 may further include one or more memories 124 and one or more controller/interface circuits 127. Memory 124 allows the storage of various data and information (such as user-data, intermediate results, calculation results, etc.) within PLD 103. Memory 124 may have a granular or block form, as desired. Controller/interface circuit 127 allows interfacing to, and communicating with memory 124.

As noted above, in various embodiments (IC 100 generally or PLD 103), a phase of a clock signal is varied in order to find an appropriate or optimal clock phase for proper communication with memory 124. The clock phase is then used to interface with memory 124.

Figure 3:
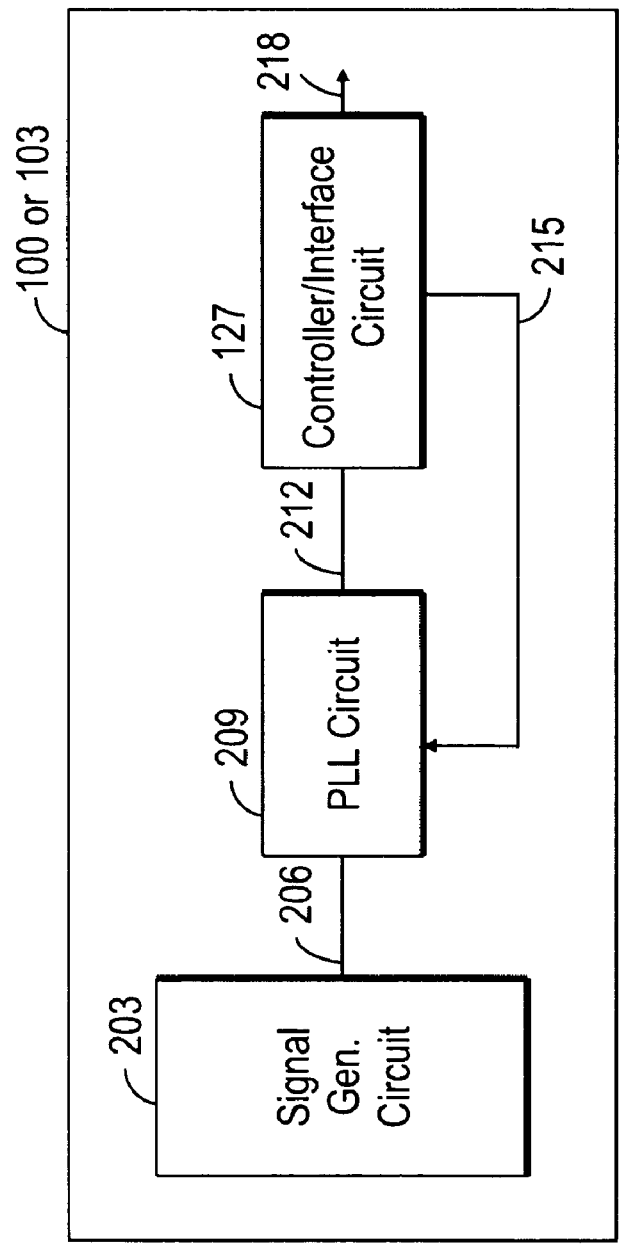
FIG. 3 shows a mechanism for generating clock signals with appropriate phases according to an exemplary embodiment.

FIG. 3 shows a mechanism for generating clock signals with appropriate phases according to an exemplary embodiment. IC 100 (or PLD 103) includes signal generator 203, and phase locked loop (PLL) 209. Signal generator 203 generates an output signal 206, which it provides to PLL 209. Output signal 206 may constitute a clock signal. As persons of ordinary skill in the art who have the benefit of the description of the disclosed concepts understand, signal generator 203 may constitute an I/O pin on IC 100 or PLD 103, or another structure in the device, for instance, programmable interconnect 109 in PLD 103, or a signal from another PLL.

PLL 209 uses output signal 206 of signal generator 203 as an input signal in order to generate PLL signal 212. The operation and structure of PLL 209 is known to persons of ordinary skill in the art.

PLL 209 provides PLL signal 212 to controller/interface circuit 127. PLL signal 212 may constitute a clock signal or signals, as desired, depending on a given implementation or given specifications. Controller/interface circuit 127 may use PLL signal 212 or one or more signals 218, derived from PLL signal 212 (e.g., by frequency division), to interface or clock memory 124 (not shown explicitly).

Generally, PLL 209 may change the phase and/or frequency of PLL signal 212. Controller/interface circuit 127 uses one or more signals 215 to cause PLL 209 to change the phase and/or frequency of PLL signal 212.

In various exemplary embodiments, controller/interface circuit 127 attempts communicating with (e.g., clocking, interfacing, transferring data) memory 124 (not shown explicitly) using PLL signal 212 (or signal 218). Controller/interface circuit 127 keeps track of and records information about the results of the communication with memory 124. For example, controller/interface circuit 127 may record or store whether the communication succeeded, the phase of PLL signal 212, etc.

Controller/interface circuit 127 uses signal(s) 215 to cause PLL 209 to change the phase of PLL signal 212. In exemplary embodiments, controller/interface circuit 127 causes (through signal(s) 215) PLL 209 to sweep or change (one or more times) the phase of PLL signal 212 through a range of phase values, using given or desired phase increments. By sweeping through a range of phase values, or changing the phase value, one may evaluate the performance of the interface with memory 124 and the performance of memory 124 (e.g., data transfer rate, transfer reliability, etc.).

As noted, the phase change sweep may occur using desired increments. Furthermore, the phase change sweep may occur over any desired range(s) of phase values. For example, the phase change sweep may occur over a 360-degree range in some exemplary embodiments, and over a 720-degree range in some other exemplary embodiments. Generally, the phase change or sweep may occur over an (M*360)-degree range of phase values, where M denotes an integer.

At each phase value, controller/interface circuit 127 keeps track of and records information about the results of the communication with memory 124. As noted above, controller/interface circuit 127 may, for example, record or store whether the communication succeeded, the phase of PLL signal 212, etc.

At the conclusion of the phase change or sweep, controller/interface circuit 127 can select the phase value that provides proper operation of memory 124 and interface and communication with memory 124. For example, controller/interface circuit 127 may determine which phase value or phase windows (including, as desired, the start, end, and center values for the windows) would result in reliable or robust data transfer to and from memory 124. As another example, controller/interface circuit 127 may determine which phase value or phase windows (including, as desired, the start, end, and center values for the windows) would result in the highest speed of operation and data transfer to and from memory 124.

As persons of ordinary skill in the art who have the benefit of the description of the disclosed concepts understand, one may use other criteria for selecting a phase value in addition to, or instead of, the criteria described above. For example, one may select a phase value so that operation of memory 124 and/or and communication to and from memory 124 satisfy a given margin of safety, e.g., one or more margins for various signal or event timing values.

Regardless of the criterion (or a combination of criteria, as desired), controller/interface circuit 127 may select a phase value and communicate that phase value to PLL 209 (via signal(s) 215). PLL 209 may then generate PLL signal 212 with that phase value.

In addition to selecting a phase value, one may also periodically adjust or calibrate the phase value based on changes in temperature, voltage, and the like. Specifically, the performance of practical circuits varies as a function of temperature and voltage or current levels. Thus, over time, a static phase value may not provide optimal or proper circuit operation.

Accordingly, in exemplary embodiments, controller/interface circuit 127 may periodically adjust the phase value used by PLL 209 in response to changes in voltage, temperature, current, etc., or a combination of those factors. One may implement such functionality by using sensors that sense values of the parameter(s) (e.g., voltage, temperature, etc.), and a circuit that translates the sensed value(s) to changes in the phase value (e.g., a look-up table).

Figure 4:
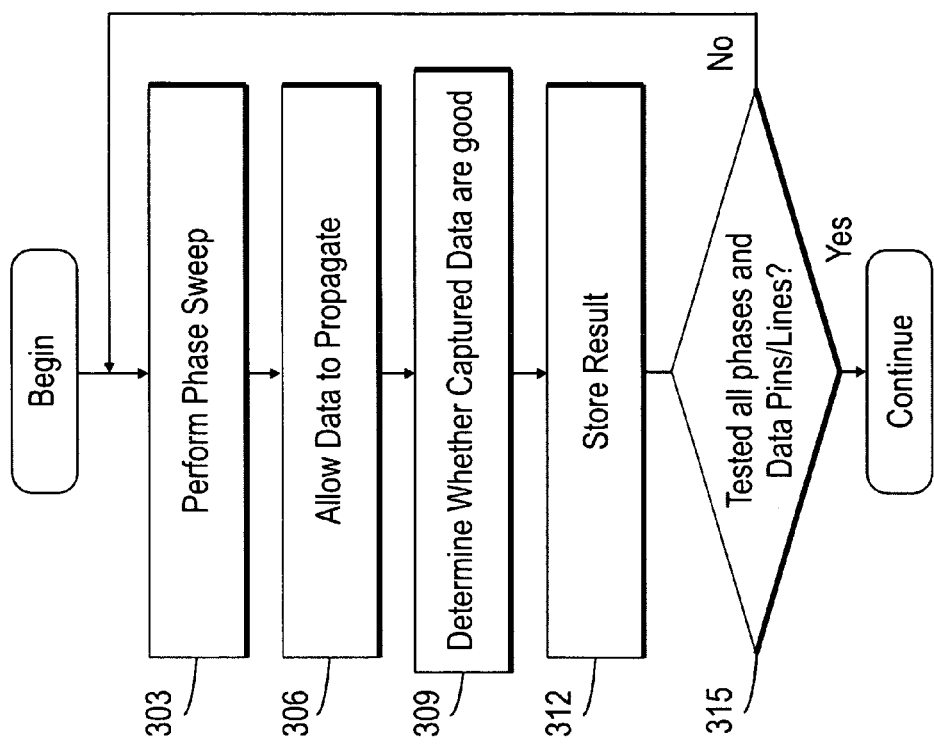
FIG. 4 depicts a simplified flow diagram for selecting or calculating settings for a memory circuit or device according to an exemplary embodiment.

FIG. 4 depicts a simplified flow diagram for selecting or calculating settings for operation of a memory circuit or device according to given or desired specifications or criteria. At 303, a phase change or sweep is performed. As noted above, the phase change or sweep may occur with a desired phase increment and over a desired phase range.

For each phase value in the phase range, at 306 data are allowed to propagate to and/or from memory device(s) or circuit(s). At 309, a determination is made whether data captured from the memory device(s) or circuit(s) meet one or more specified or desired criteria (e.g., whether the data are "good").

At 312, the results of the determination at 309 are stored or recorded. At 315, a determination is made whether all phases and data pins or lines to be tested have been tested. If so, a phase value is subsequently selected. If not, the phase change or sweep continues at 303.

In exemplary embodiments, the selected phase value may be periodically adjusted in response to changes in voltage, temperature, current, etc., or a combination of those factors. The periodic adjustment provides a way of correcting or optimizing the phase value based on environmental or operational characteristics of the circuit.

Figure 5:
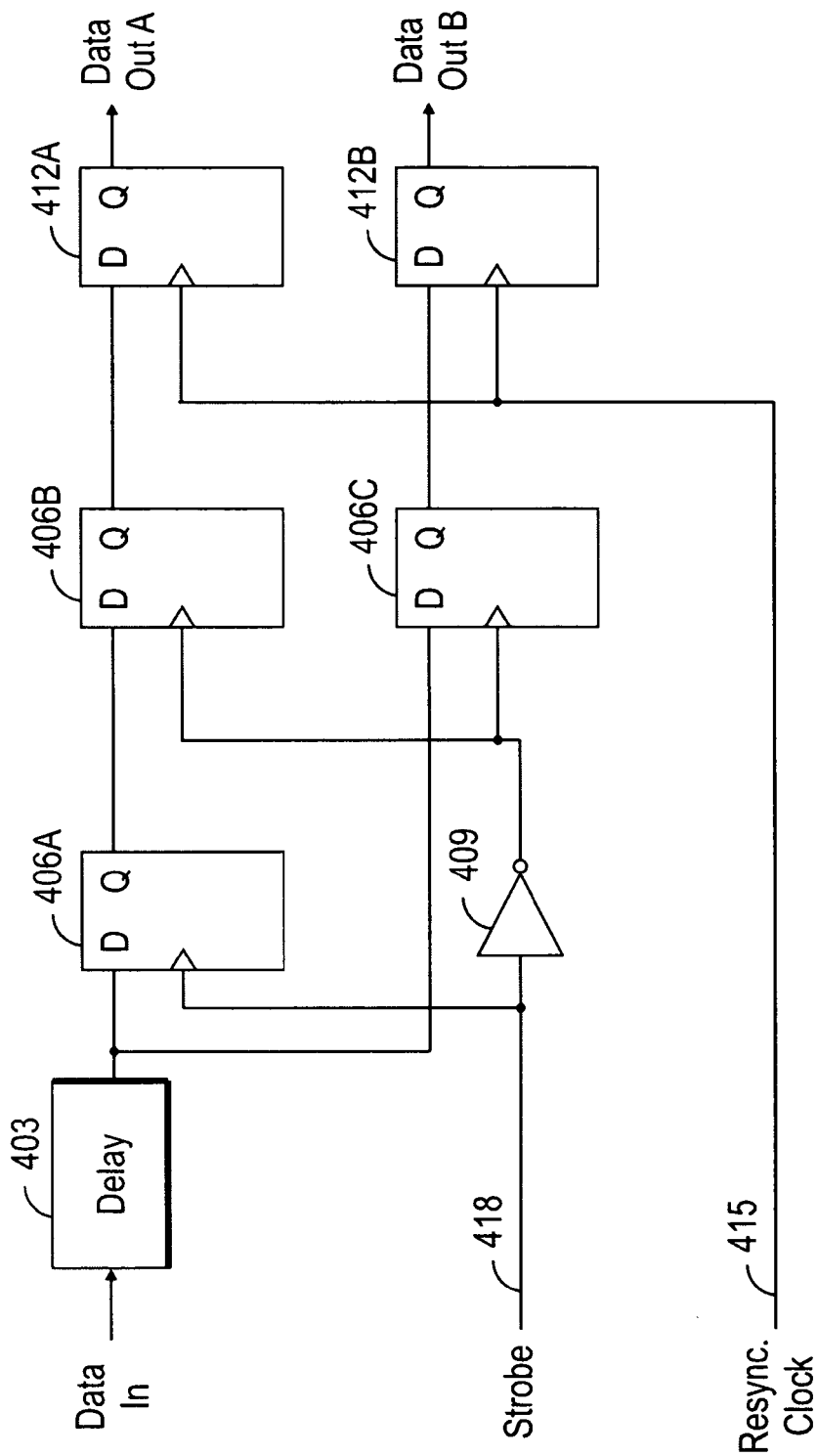
FIG. 5 illustrates a data capture scheme according to an exemplary embodiment.
Figure 6:
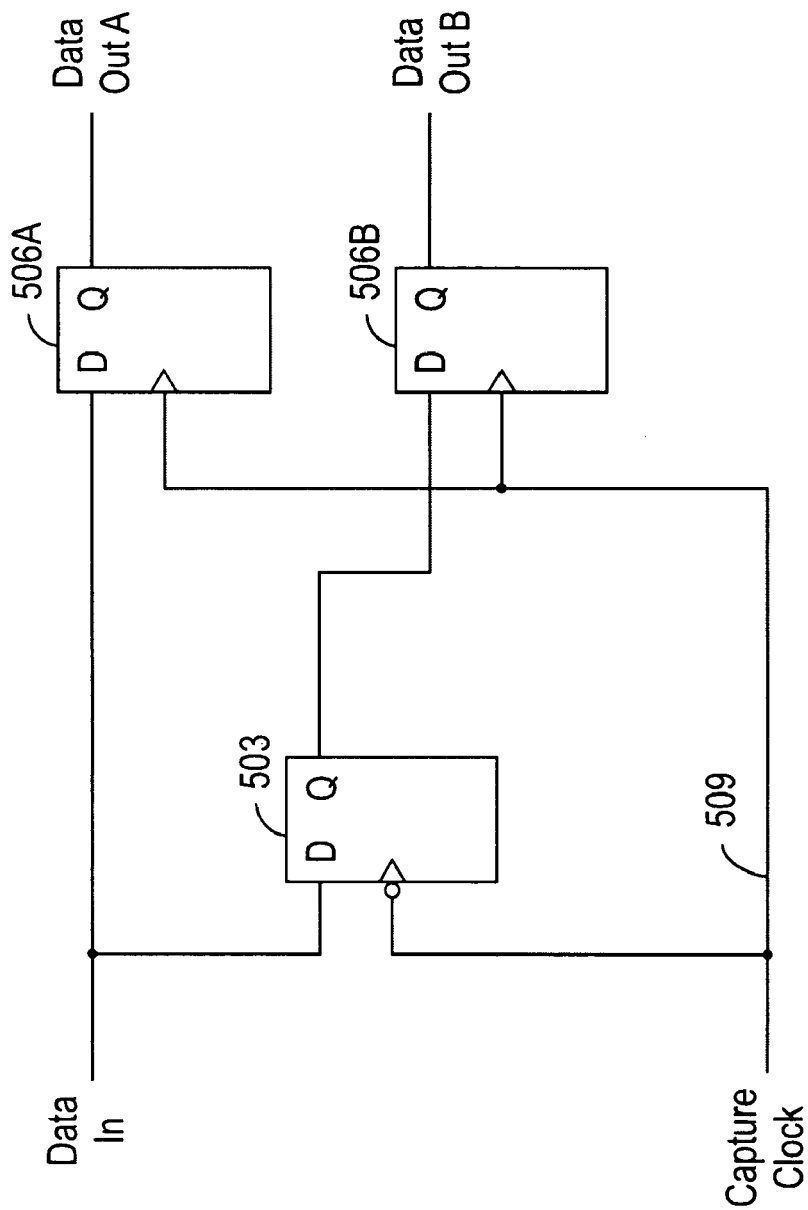
FIG. 6 depicts another data capture scheme according to an exemplary embodiment.

As noted above, one may use the disclosed concepts with DDR memory. In this application, one may use DQS-based data capture, or calibrated capture clock to transfer data to and from memory. FIGS. 5 and 6 illustrate those two data capture schemes, respectively.

Referring to FIG. 5, registers 406A-406C constitute data capture registers. The input data are provided to capture registers 406A-406C via delay circuit 403. A strobe clock signal 418 clocks registers 406A-406C. Specifically, clock signal 418 couples to register 406A, whereas the inverted version of clock signal 418 (produced by inverter 409) couples to registers 406B-406C.

The output of registers 406B-406C drive the data inputs of resynch (resynchronization) registers 412A-412C. Registers 412A-412C provide the output data. The output data may be provided to other circuitry, such as IC circuitry 102 (see FIG. 1), or circuitry within PLD 103 (see FIG. 2), etc.

Resynch clock signal 415 serves as the clock signal for registers 412A-412C. Resynch clock signal 415 constitutes output signal 218 (not shown explicitly) of controller/interface circuit 127 (not shown explicitly), PLL signal 212 (not shown explicitly), or a signal derived from one of those signals. Thus, resynch clock signal 415 is calibrated in the circuit shown in FIG. 5.

In contrast, in the circuit of FIG. 6, the capture clock signal is calibrated. Referring to FIG. 6, the input data are provided to registers 503 and 506A. The output of register 503 drives the data input of register 506B. Registers 506A-506B provide the output data. The output data may be provided to other circuitry, such as IC circuitry 102 (see FIG. 1), or circuitry within PLD 103 (see FIG. 2), etc.

Capture clock signal 509 serves as the clock signal for register 503 and registers 506A-506B. Capture clock signal 509 constitutes output signal 218 (not shown explicitly) of controller/interface circuit 127 (not shown explicitly), PLL signal 212 (not shown explicitly), or a signal derived from one of those signals. Thus, capture clock signal 509 is calibrated in the circuit shown in FIG. 6.

One aspect of the disclosed circuits relates to circuitry for determining the optimal, desired, or proper phase value by changing or sweeping phase values. In exemplary embodiments, one may use a shift register to implement that functionality.

Figure 7:
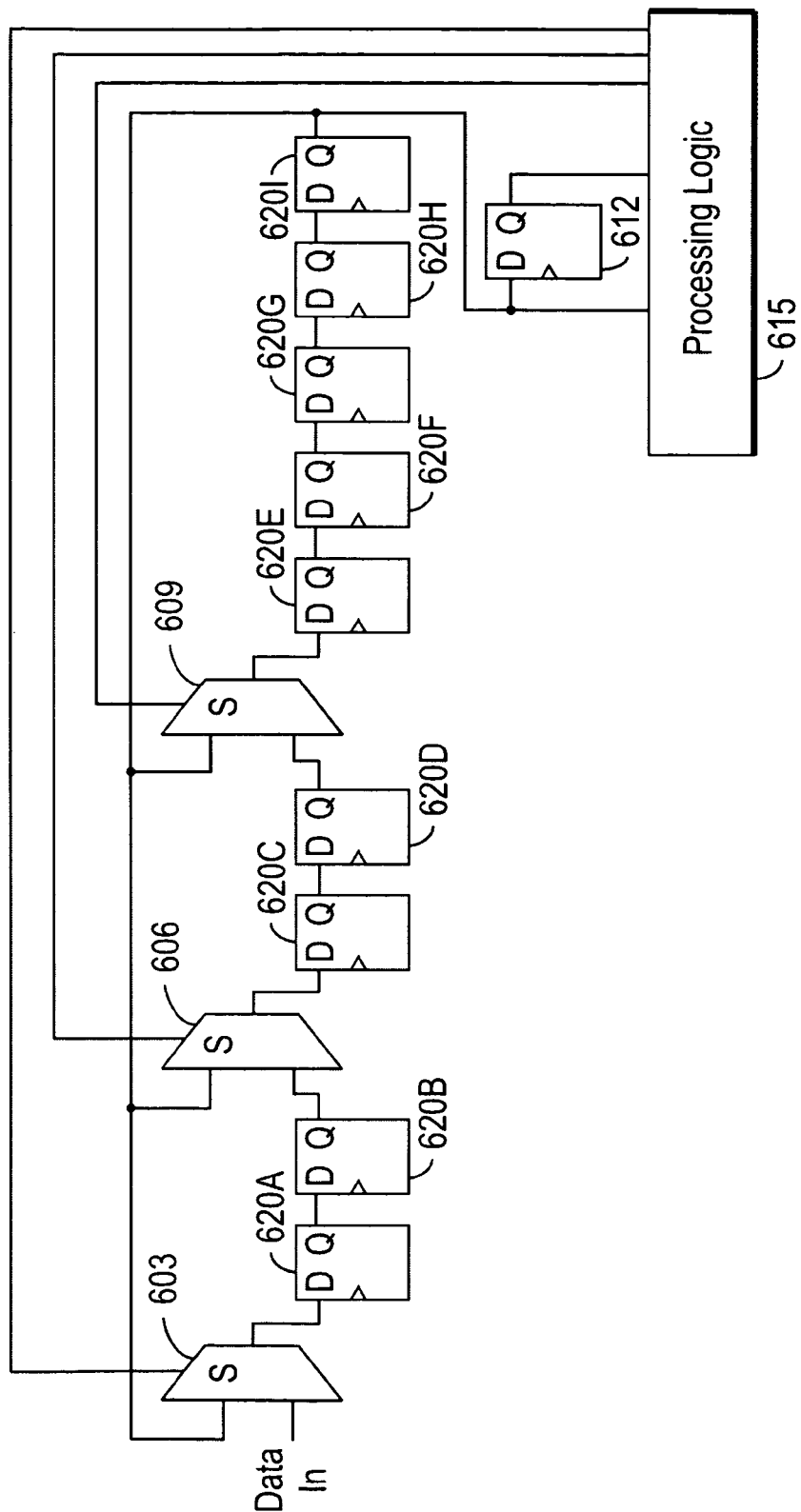
FIG. 7 illustrates a circuit according to an exemplary embodiment for sweeping or changing phase values.

FIG. 7 a shift-register-based circuit according to an exemplary embodiment for changing or sweeping phase values. The circuit in FIG. 7 includes multiplexers (MUXs) 603, 606, and 609; registers 620A-620I, register 612, and processing logic circuit 615.

Registers 620A-620I form a shift register. Thus, the Q output of register 620A couples to the data (D) input of register 620B, and so on (including the selective coupling provided by MUXs 603, 606, and 609).

Processing logic circuit 615 constitutes a controller for the circuit in FIG. 7. One may implement processing logic circuit 615 in a variety of ways, as persons of ordinary skill in the art who have the benefit of the description of the disclosed concepts understand. For example, in some exemplary embodiments, one may use a finite state machine (FSM). As another example, in some illustrative embodiments, one may use a microcontroller, or a microprocessor or, generally, a processor.

In the embodiment shown, one may select to serially load the shift register or use vector sizes of 5, 7, or 9 for the shift register by using MUXs 603, 606, and 609. Put another way, MUXs 603, 606, and 609, under the control of processing logic circuit 615, provide a mechanism for changing the length of the shift register when acting as a barrel shifter.

As shown in FIG. 7, processing logic circuit 615 controls the select (S) inputs of MUXs 603, 606, and 609. One input to MUXs 603, 606, and 609 constitutes the output signal of register 620I (the last register in the shift register). A second input of MUX 603 constitutes the input data. A second input of MUX 606 constitutes the output of register 620B, whereas a second input of MUX 609 constitutes the output of register 620D.

As noted, one may use MUXs 603, 606, and 609 to select a desired vector size. For example, to select a vector size of 7, one causes (via processing logic circuit 615) MUX 606 to couple the output of register 620I to the input of register 620C, and MUX 609 to couple the output of register 620D to the input of register 620E.

In similar fashion, one may select vector sizes of 5 or 9. To select a vector size of 5, one causes (via processing logic circuit 615) MUX 609 to couple the output of register 620I to the input of register 620E. Generally speaking, as persons of ordinary skill in the art who have the benefit of the description of the disclosed concepts understand, one may use the disclosed concepts to a wide variety of vector sizes, by making appropriate modifications to the circuitry and techniques shown and described.

To load data into the shift register, MUX 603 (under control of processing logic 615) passes data from the data input to register 620A. MUX 606 and 609 pass the data through the scan chain, i.e., from register 620B to register 620C, and from register 620D to register 620E, respectively. When all the bits have been shifted into the shift register (registers 620A-620I), then the vector may be shifted to cope with a vector of smaller then 9 and get the first bit into register 620I, as desired.

As persons of ordinary skill in the art who have the benefit of the description of the disclosed concepts understand, one may apply many modifications and tweaks to the disclosed concepts, circuits, and techniques that can cover processing the data to detect the largest group of ones (binary 1s) in a linear window. Other modifications, like adding a padding of binary 0 as the last bit of data loaded can simplify such tasks. Indeed, for some edge detection conditions like 'last failing phase,' a signal from the output of register 620K can be useful.

Thus, the embodiment shown in FIG. 7 supports a serial-loading shift register with vector sizes of 5, 7, and 9. For vector sizes of 5, 7 and 9, the circuit uses a circular window. Note, however, that one may use other vector sizes, as desired, by making modifications that fall within the level of skill of persons of ordinary skill in the art who have the benefit of the description of the disclosed concepts. The choice of circular versus linear window is made through the processing logic circuit 615 (e.g., an FSM), which determines the maximum number of shifts.

Furthermore, one may use a parallel-loading shift register, as desired. The parallel-loading shift register may have desired vector sizes. One may implement such options by making modifications to the circuit in FIG. 7 that fall within the level of skill of persons of ordinary skill in the art who have the benefit of the description of the disclosed concepts.

Typically, a range of valid phase values exist for a given circuit and operating conditions. One may consider the range of phase values a window. The circuit in FIG. 7 operates by finding the center of largest window of phase values that produce valid captured data. One bit in each stage of the shift register represents pass or fail for that setting of phase value.

With the aid of the shift register, processing logic 615 evaluates a range of phase values over a set of windows. The windows may indicate that use of a particular phase value or range of phase values results in a pass condition (i.e., proper data capture to/from the memory) or a fail condition (i.e., faulty or improper data capture to/from the memory). As persons of ordinary skill in the art who have the benefit of the description of the disclosed concepts understand, fringing effects of unstable pass/fail conditions on the interface being calibrated may manifest themselves as multiple windows.

The shift register forms a barrel shifter. As noted above, the data are shifted serially around the barrel shifter. During this process, processing logic circuit 615 detects the start or end of a window using 0-to-1 and 1-to-0 transitions.

Start and end conditions of a window are used to calculate their start, size, and center values. Register 612 holds the value which was shifted out of register 620I. Doing so minimizes the comparison logic, as otherwise the pervious value which was in register 620I would have to be read from register 620A, 620C, or 620E depending on the length of vector selected As noted, one may program the shift register to perform the above operations over a circular window (barrel shifting) or a linear range. This property allows performing edge detection (rising or falling edges), which may be used for write leveling, post-amble, and or de-skew calculations during calibration, as persons of ordinary skill in the art who have the benefit of the description of the disclosed concepts understand.

In addition, the shift register may be programmed to operate as a linear window over N+1 bits. if the (N+1)th bit is forced to binary zero as it is loaded, then one will find a valid window of phase values. For example, a 6 bit linear window may be loaded into the vector length 7, padded with a zero (fail). When processed as a circular window, the padding bit(s) cause the circuit to see the window of the desired size and force the result into the appropriate range. One may use this attribute for de-skew calculations, as persons of ordinary skill in the art who have the benefit of the description of the disclosed concepts understand.

Note that one may dynamically (on the fly) select a vector size, i.e., the register in the shift register into which the output of the last register if fed. This attribute allows using one circuit at different clock frequencies, as different clock frequencies may mandate a different number of phase steps per clock cycle, hence a different vector size. An example constitutes structured ASIC products, such as HardCopy devices provided by Altera Corporation, the assignee of this patent application. Choosing the maximum vector size limits the maximum number of phases available; however any setting that utilizes fewer phase steps would be supported. Furthermore, because of this attribute, one may use the same circuit for tracking and resynch calculation, as persons of ordinary skill in the art who have the benefit of the description of the disclosed concepts understand.

Note that one may use a phase window of 360 degrees or 720 degrees, as desired. For example, one may use a 360-degree window for non DQS-based applications (see FIG. 6), as persons of ordinary skill in the art who have the benefit of the description of the disclosed concepts understand. Conversely, one may use a 720-degree window for half-rate PHY applications or a DQS based capture scheme (see FIG. 5). Optionally, the results may be mapped into the first 360 degrees, as desired.

One may use merely one bit as a pass/fail flag for each phase value. Doing so results in circuitry with relatively small sizes, and also results in relatively fast speeds of operation.

Furthermore, one may perform a logical operation on the results of phase window determination for a number of data bits or pins at the same point in the shift register. By doing so, one may merge the results (i.e., pass/fail windows) for each data pin or bit into one pass/fail window for the memory interface. For example, one may perform a logical AND operations on the results from different pins together to produce an aggregated value that once processed provides a result that will work for all pins. This operation may be performed while loading the data into the shift register (i.e., registers 620A-620I). Alternatively, one may hold data from one pin and perform a logical AND with data from the next pin before performing a shift operation.

Another option is to store all the phase results for one pin, and then perform a logical AND operation on the value stored in the shift register with the value being loaded in. Other options for performing logical operations exist, as persons of ordinary skill in the art who have the benefit of the description of the disclosed concepts understand.

In addition, note that one may use processing logic circuit to provide a variety of pass or fail information that depend on the type of processing being performed. For example, one may indicate a failure condition based on no binary 1s present (i.e., no passes), no binary 0s present (no fails), multiple equally sized windows, etc. This ability facilitates debugging of the PHY and electrical interfaces, especially in more complex systems, such as DDR3.

Figure 8:
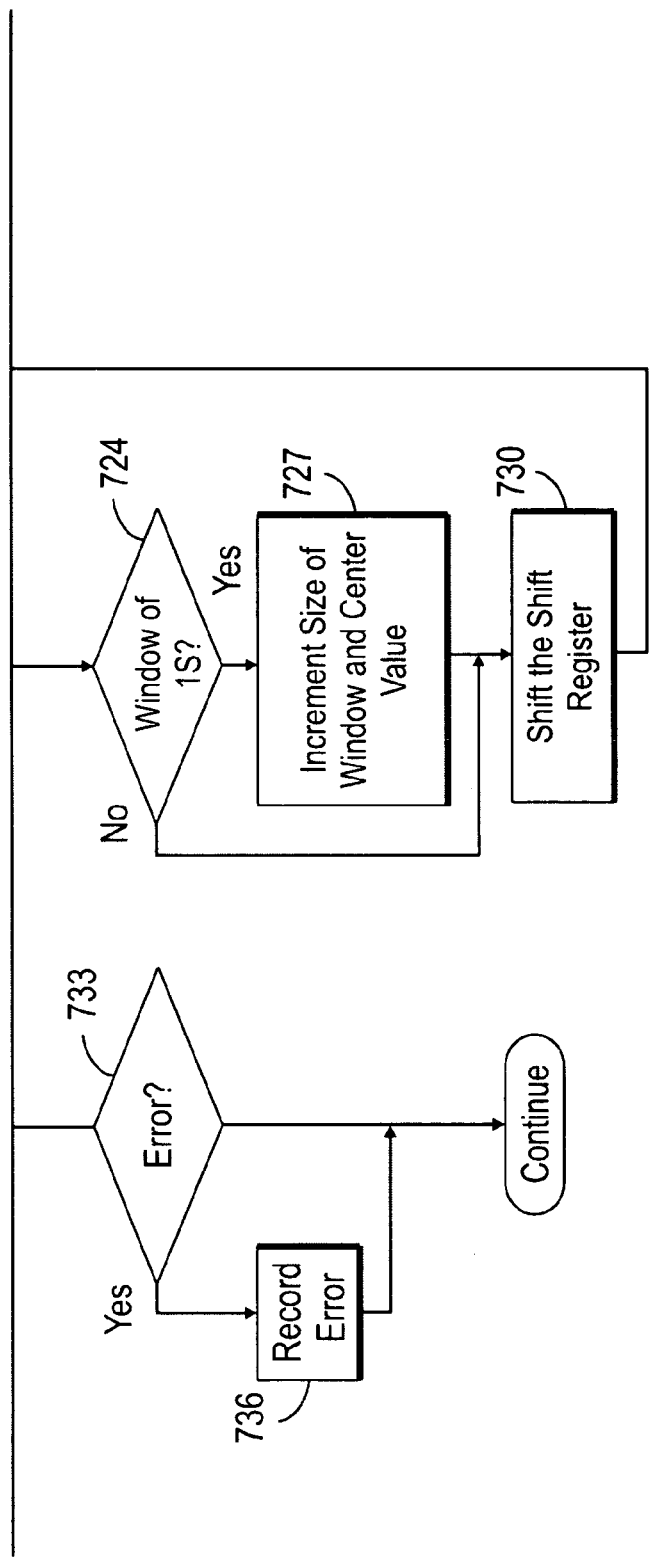
FIG. 8 shows a simplified flow diagram for some of the operations of the circuit in FIG. 7.

FIG. 8 shows a simplified flow diagram for some of the operations of the circuit in FIG. 7. At 703, a vector size is selected, and at 706, the shift register is configured accordingly.

At 709, a check is made to determine whether the processing has finished. If so, at 733, a determination is made whether an error has occurred and, if so, the error is recorded at 736.

If the processing has not finished, at 712 a determination is made whether a start of a window is detected (e.g., a binary 1 value in the shift register 620I and binary 0 in register 612). If so, information about the start of the window is stored at 715. Also, if the start of the window is the first start condition encountered, then a flag is set to stop processing when this position is re-encountered in the shifted data, thus forming one of the 'done' conditions at 709.

If a window start is not detected (e.g., a binary 0 value), at 718 a determination is made whether a window end has occurred. If so, if the size of the window is the largest so far encountered, that information is stored at 721.

Otherwise, a determination is made at 724 whether the current bit of the window that is being examined is a binary 1. If so, at 727, the size of the window is incremented, and the center value of the window is updated every other cycle (i.e., via the divide-by-two operation). At 730, the shift register is shifted, and processing continues at 709.

As persons of ordinary skill in the art who have the benefit of the description of the disclosed concepts understand, one may apply the disclosed concepts effectively to various ICs. Examples described in this document (e.g., general purpose ICs, ASICs, PLDs) constitute merely illustrative applications, and are not intended to limit the application of the disclosed concepts to other ICs by making appropriate modifications. Those modifications fall within the knowledge and level of skill of persons of ordinary skill in the art who have the benefit of the description of the disclosed concepts.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus, comprising:
   a memory circuit; and
   an interface circuit, coupled to the memory circuit, that receives a clock signal having a phase value, and provides to a source of the clock signal a signal to sweep the phase value of the clock signal; wherein the clock signal is adapted to clock the memory circuit.

2. The apparatus according to claim 1, wherein the interface circuit selects the phase value by evaluating a range of phase values using a set of windows.

3. The apparatus according to claim 2, wherein the interface circuit evaluates each window in the set of windows to determine a pass condition or a fail condition.

4. The apparatus according to claim 1, wherein the interface circuit selects the phase value by performing a phase change over a range of phase values, and capturing data for each phase value in the range of phase values.

5. The apparatus according to claim 4, wherein the interface circuit evaluates the data captured for each phase value in the range of phase values.

6. The apparatus according to claim 4, wherein the phase change is performed over a 360-degree range of phase values.

7. The apparatus according to claim 4, wherein the phase change is performed over a 720-degree range of phase values.

8. The apparatus according to claim 4, wherein the phase change is performed over an (M*360)-degree range of phase values, where M is an integer.

9. An integrated circuit (IC), comprising:
a memory circuit; and
an interface circuit, coupled to the memory circuit, that provides a clock signal to the memory circuit, the interface circuit comprising a selectable vector size shift register that changes a phase of the clock signal to select a phase value appropriate for interfacing with the memory circuit.

10. The integrated circuit (IC) according to claim 9, wherein the clock signal is derived from an output signal of a phase locked loop (PLL) coupled to the interface circuit.

11. The integrated circuit (IC) according to claim 10, wherein the interface circuit causes the phase locked loop (PLL) to generate the output signal with the selected phase value.

12. The integrated circuit (IC) according to claim 9, wherein the shift register is serially loaded.

13. The integrated circuit (IC) according to claim 9, wherein the shift register is loaded in parallel.

14. The integrated circuit (IC) according to claim 9, wherein interfacing with the memory circuit comprises performing a DQS-based data capture.

15. The integrated circuit (IC) according to claim 9, wherein interfacing with the memory circuit comprises performing a calibrated capture clock data capture.

16. The integrated circuit (IC) according to claim 9, wherein the shift register changes the phase of the clock signal by using a set of windows.

17. The integrated circuit (IC) according to claim 16, wherein the interface circuit selects a window from the set of windows that has a largest size.

18. The integrated circuit (IC) according to claim 17, wherein the interface circuit calculates a center of the selected window.

19. The integrated circuit (IC) according to claim 9, further comprising programmable logic circuitry coupled to the interface circuit.

20. The integrated circuit (IC) according to claim 9, further comprising programmable interconnect circuitry coupled to the interface circuit.

21. An integrated circuit (IC), comprising:
a memory circuit; and
an interface circuit, coupled to the memory circuit, that receives a clock signal having a phase value, and provides to a source of the clock signal a signal to change the phase value of the clock signal; the clock signal adapted to clock the memory circuit during a data capture operation such that the results of the data capture operation meet a specified criterion.

22. The integrated circuit (IC) according to claim 21, wherein the specified criterion comprises the results of the data capture being valid.

23. The integrated circuit (IC) according to claim 21, wherein the phase value of the clock signal is selected by evaluating a range of phase values using a set of windows.

24. The integrated circuit (IC) according to claim 23, wherein each window in the set of windows is evaluated to determine a pass condition or a fail condition.

25. The integrated circuit (IC) according to claim 21, wherein the phase value of the clock is selected by changing the phase value of the clock signal over a range of phase values, and capturing data for each phase value in the range of phase values.

26. The integrated circuit (IC) according to claim 25, wherein the data captured for each phase value in the range of phase values are evaluated.

27. The integrated circuit (IC) according to claim 25, wherein the phase value of the clock signal is changed over a 360-degree range of phase values.

28. The integrated circuit (IC) according to claim 25, wherein the phase value of the clock signal is changed over a 720-degree range of phase values.

* * * * *